United States Patent
Chang et al.

(10) Patent No.: US 7,692,968 B2
(45) Date of Patent: Apr. 6, 2010

(54) OPERATION METHOD OF NON-VOLATILE MEMORY AND METHOD OF IMPROVING COUPLING INTERFERENCE FROM NITRIDE-BASED MEMORY

(75) Inventors: Yao-Wen Chang, Hsinchu (TW); Guan-Wei Wu, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 346 days.

(21) Appl. No.: 11/782,149

(22) Filed: Jul. 24, 2007

(65) Prior Publication Data

US 2008/0266966 A1    Oct. 30, 2008

Related U.S. Application Data

(60) Provisional application No. 60/913,817, filed on Apr. 25, 2007.

(51) Int. Cl.
*G11C 11/34* (2006.01)

(52) U.S. Cl. .......................... 365/185.18; 356/185.05; 356/185.27

(58) Field of Classification Search ............ 365/185.18, 365/185.05, 185.27
See application file for complete search history.

(56) References Cited

U.S. PATENT DOCUMENTS

| | | | |
|---|---|---|---|
| 7,106,625 | B2 | 9/2006 | Yeh |
| 7,184,316 | B2 * | 2/2007 | Cho et al. ............ 365/185.28 |
| 2006/0202252 | A1 | 9/2006 | Wang et al. |
| 2006/0252204 | A1 | 11/2006 | Han et al. |
| 2007/0002627 | A1 | 1/2007 | Youn |

OTHER PUBLICATIONS

"Effects of Floating-Gate Interference on NAND Flash Memory Cell Operation", Jae-Duk Lee,Sung-Hoi Hur, and Jung-Dal Choi,IEEE Electron Device Letters, vol. 23, No. 5,[264-266], May 2002.

* cited by examiner

*Primary Examiner*—Son Dinh
(74) *Attorney, Agent, or Firm*—J.C. Patents

(57) ABSTRACT

An operation method of a non-volatile memory is provided. The operation method is that a reading operation is performed to a selected nitride-based memory cell, a first positive voltage is applied to a word line adjacent to one side of the selected memory cell and a second positive voltage is applied to another word line adjacent to the other side of the selected memory cell. The operation method of this present invention not only can reduce a coupling interference issue but also can obtain a wider operation window.

38 Claims, 7 Drawing Sheets

OPERATION METHOD OF NON-VOLATILE MEMORY AND METHOD OF IMPROVING COUPLING INTERFERENCE FROM NITRIDE-BASED MEMORY

CROSS-REFERENCE TO RELATED APPLICATION

This application claims the benefit of U.S. Provisional Application No. 60/913,817, filed on Apr. 25, 2007. The entirety of the above-mentioned patent application is hereby incorporated by reference herein and made a part of this specification.

BACKGROUND OF THE INVENTION

1. Field of the Invention

The present invention relates to an operation method for a memory structure, in particular, to an operation method for a non-volatile memory and a method for improving coupling interference of a nitride-based memory.

2. Description of Related Art

A typical non-volatile memory cell has a floating gate and a control gate made by doped polysilicon. The floating gate is disposed between the control gate and a substrate. And, the floating gate is in a floating state and is not electrically connected to any circuit. The floating gate is used to store charges, while the control gate is used to control a data writing/reading operation. The memory cell having the floating gate structure can be used as one bit/cell, single level cell (SLC) or multi-level cell (MLC) and made into a NAND-type array structure.

In addition to the aforementioned floating-gate-based memory cell, a nitride-based memory cell that uses silicon nitride to be a charge trapping layer as a replacement for the polysilicon floating gate has become another mainstream non-volatile memory cell. What makes the nitride-based memory cell more outstanding than the floating-gate-based memory cell is the fabrication process can be easily integrated and the nitride-based memory cell can store 2 bits of data or multi-bits of data. Furthermore, it is often expected that the nitride-based memory cell has no coupling interference issue. The coupling interference issue occurs when the distance between each two devices is too close, thereby resulting in a threshold voltage shift (Vt shift), which is the most important limitation when the aforementioned floating gate based memory cell is continuingly miniaturized.

However, the applicant of this present invention first disclosed that the nitride-based memory structure has similar issue to the aforementioned coupling interference issue. Referring to FIG. 1, FIG. 1 is a diagram illustrating a relationship between currents and voltages measured when performing a reading operation on two different sized memory cells and applying a negative bias voltage to word lines at two sides of the memory cell. In FIG. 1, —■— represents the measurement results of the currents and the voltages according to a smaller sized memory cell D2; —●— represents the measurement results of the currents and the voltages according to a bigger sized memory cell D1; X axis represents a gate voltage (VG); and Y axis represents a read current. As shown in FIG. 1, after the size of the memory cell is miniaturized, which means a spacing between each two adjacent word lines is shorten, the read current is more prone to be impacted by the bias change of adjacent word lines.

Referring to FIG. 2A and FIG. 2B, FIG. 2A and FIG. 2B are a top view of a bit line layout and a diagram illustrating a relationship between bit counts and Vt shift values for different word lines respectively. FIG. 2A illustrates 8 word lines WL0~WL7 arranged in parallel, wherein the critical dimension of the word lines is 60 nm. In FIG. 2B, —○— represents a voltage distribution curve as a whole, and —●—, —▲—, —▼— and —♦— are the voltage distribution curves for the word lines WL1, WL3, WL5 and WL7 respectively. As shown in FIG. 2A and FIG. 2B, when the bits of the word lines WL0, WL2, WL4 and WL6 are programmed to reach a "0" state, the Vt shift values of the adjacent word lines WL1, WL3, WL5 and WL7 increase.

It can be deduced from the experiment results provided by the applicant of the present invention that when miniaturizing the memory cell, if the distance between each two adjacent word lines is too close, it results in the coupling interference issue of the nitride-based memory cell. Moreover, it is known from FIG. 2A and FIG. 2B that the Vt shift values of the word lines, WL1, WL3 and WL5 which have interference from two sides are bigger; while the Vt shift value of the word line WL7 which has interference from one side is smaller.

In addition, referring to FIG. 3A and FIG. 3B, FIG. 3A and FIG. 3B are Vt distribution diagrams for the nitride-based memory cell without consideration of the coupling interference issue and in consideration of the coupling interference issue respectively. As shown in FIG. 3A, numeral 310 represents the Vt distribution curve when the data storage state is "1"; numeral 320 represents the Vt distribution curve when the data storage state is "0"; and an operation window W1 represents the difference between two different data storage states. As shown in FIG. 3B, the coupling interference issue makes the Vt where the data storage state is "1" shift to be a curve marked as numeral 312, and makes the Vt where the data storage state is "0" shift to be another curve marked as numeral 322. At this moment, if comparing an operation window W2 with the operation window W1, W2 is relatively narrower than W1. In light of the above, when defining the operation windows, the coupling interference issue will have different influences to different data storage states of the nitride-based memory.

As discovered by the applicant of the present invention, the coupling interference issue exists in the nitride-based memory, and thereby the Vt of the memory cell is increased and it makes the operation window narrower; therefore, the applicant of the present invention looks for methods to improve the problem, so that the technique development of the non-volatile memory cells can advance forward.

SUMMARY OF THE INVENTION

In solution, the present invention is directed to provide an operation method for a non-volatile memory and a method for improving the coupling interference of the nitride-based memory, which can improve the coupling interference of the nitride-based memory and various derived problems.

The present invention provides an operation method for a non-volatile memory, suitable for a memory cell array comprising a plurality of buried bit lines arranged in parallel along a column direction and a plurality of word lines arranged in parallel along a row direction which is composed of a plurality of memory cells. The operation method of the present invention is that selecting the memory cell, and a first positive voltage is applied to the word line adjacent to one side of the selected memory cell; and a second positive voltage is applied to another word line adjacent to the other side of the selected memory cell.

According to an embodiment of the present invention, in the operation method of the non-volatile memory, a method of selecting the memory cell comprises: applying a gate voltage to a control gate of the selected memory cell, applying a first source/drain voltage and a second source/drain voltage to two doped regions respectively, applying a substrate voltage to a substrate for reading the selected the memory cell.

According to an embodiment of the present invention, in the operation method of the non-volatile memory, the aforementioned first positive voltage is 0.5~2 volt.

According to an embodiment of the present invention, in the operation method of the non-volatile memory, the aforesaid second positive voltage is 0.5~2 volt.

According to an embodiment of the present invention, in the operation method of the non-volatile memory, the aforesaid first positive voltage is equal to the aforesaid second voltage, wherein the voltage thereof is 0.5~2 volt.

According to an embodiment of the present invention, in the operation method, the aforementioned gate voltage is 3~5 volt, the first source/drain voltage is 1~2_ volt, the second source/drain voltage is 0 volt, and the substrate voltage is 0 volt.

According to an embodiment of the present invention, in the operation method, each of the memory cells comprises a control gate disposed on a substrate, two doped regions disposed in the substrate at two sides of the control gate, a nitride charge trapping layer disposed between the control gate and the substrate, a charge barrier layer disposed between the nitride charge trapping layer and the control gate, and a charge tunneling layer disposed between the nitride charge trapping layer and the substrate. The charge tunneling layer is an oxide layer or a complex layer, for example. The complex layer is formed on the substrate which comprising a first oxide layer, a nitride layer and a second oxide layer. The thickness of the first oxide layer is smaller than 2 nm, preferred between 0.5~2 nm, further preferred smaller than 1.5 nm. The thickness of the nitride layer is smaller than 2 nm, preferred between 1~2 nm. The thickness of the second oxide layer is smaller than 2 nm, preferred between 1.5~2 nm.

The present invention further provides a method for improving a coupling interference of a nitride-based memory structure, suitable for a memory cell array a plurality of buried bit lines arranged in parallel along a column direction and a plurality of word lines arranged in parallel along a row direction which is composed of a plurality of nitride-based memory cells. In the method of the present invention, when a reading operation is performed on the selected memory cell, a first positive voltage is applied to the word line adjacent to one side of the selected memory cell, and a second positive voltage is applied to another word line adjacent to the other side of the selected memory cell.

According to an embodiment of the present invention, in the method for improving the coupling interference of the nitride-based memory structure, the aforementioned first positive voltage is 0.5~2 volt.

According to an embodiment of the present invention, in the method for improving the coupling interference of the nitride-based memory structure, the aforementioned second positive voltage is 0.5~2 volt.

According to an embodiment of the present invention, in the method for improving the coupling interference of the nitride-based memory structure, the aforementioned first positive voltage is equal to the aforementioned second positive voltage, wherein the voltage thereof is 0.5~2 volt.

According to an embodiment of the present invention, in the method for improving the coupling interference of the nitride-based memory structure, the aforementioned reading operation is that a gate voltage is applied to the control gate of the selected memory cell, a first source/drain voltage and a second source/drain voltage are applied to the two doped regions respectively, and a substrate voltage is applied to the substrate. Wherein the gate voltage is 3~5 volt, the first source/drain voltage is 1~2 volt, the second source/drain voltage is 0 volt, and the substrate voltage is 0 volt.

According to an embodiment of the present invention, in the operation method, each of the memory cells comprises a control gate disposed on a substrate, two doped regions disposed in the substrate at two sides of the control gate, a nitride charge trapping layer disposed between the control gate and the substrate, a charge barrier layer disposed between the nitride charge trapping layer and the control gate, and a charge tunneling layer disposed between the nitride charge trapping layer and the substrate. The charge tunneling layer is an oxide layer or a complex layer, for example. The complex layer is formed on the substrate which comprising a first oxide layer, a nitride layer and a second oxide layer. The thickness of the first oxide layer is smaller than 2 nm, preferred between 0.5~2 nm, further preferred smaller than 1.5 nm. The thickness of the nitride layer is smaller than 2 nm, preferred between 1~2 nm. The thickness of the second oxide layer is smaller than 2 nm, preferred between 1.5~2 nm.

In the method of the present invention, when performing the reading operation to the selected memory cell, the positive voltages are applied to the word lines adjacent to the memory cells, thereby reducing the coupling interference and preventing the threshold voltage from being increased and affecting the operation of devices. Moreover, the present invention can overcome the limitations of miniaturization and as a result, fabricating techniques of the memory cells are advancing toward ever-miniaturizing dimensions.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
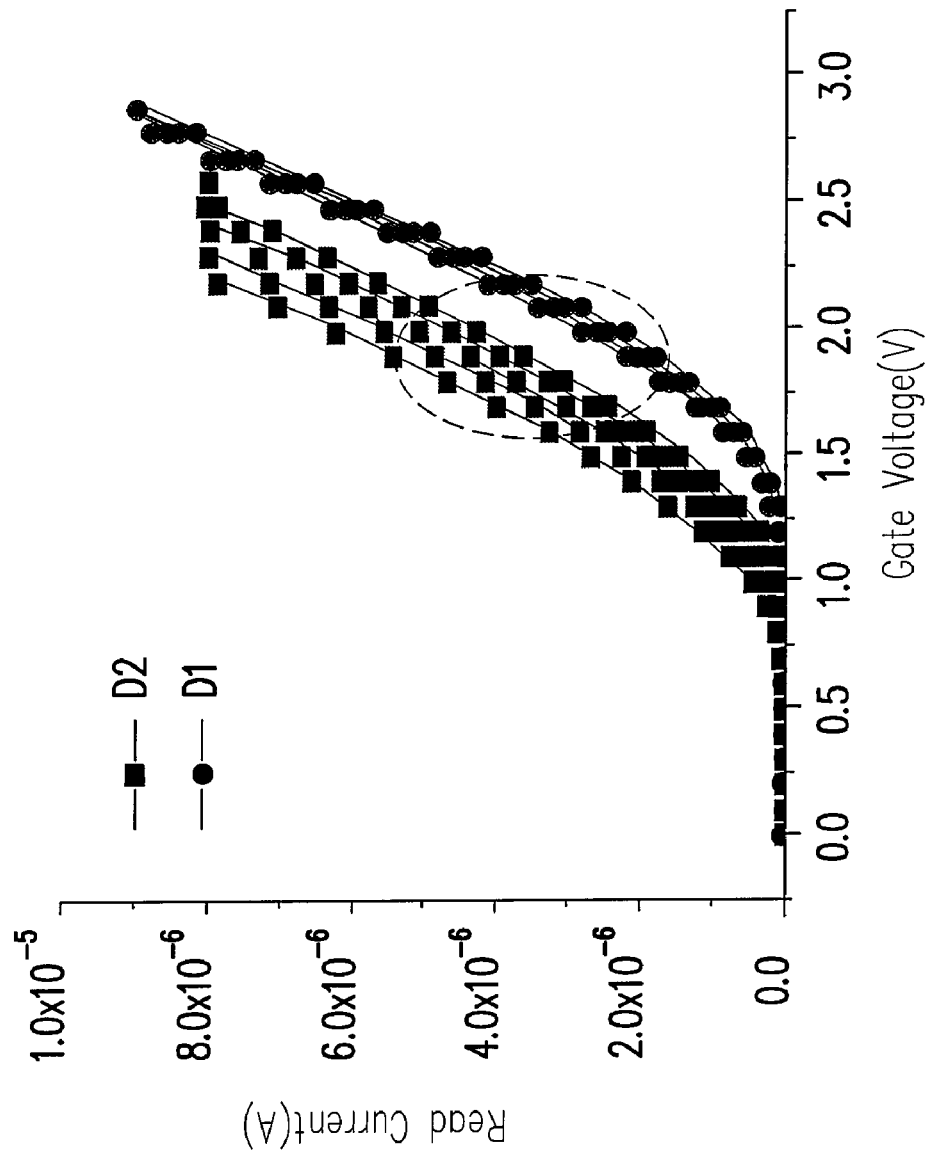
FIG. 1 is a diagram illustrating a relationship between currents and voltages measured when performing a reading operation on two different sized memory cells and applying a negative bias voltage to word lines at two sides of the memory cell.
Figure 2A:
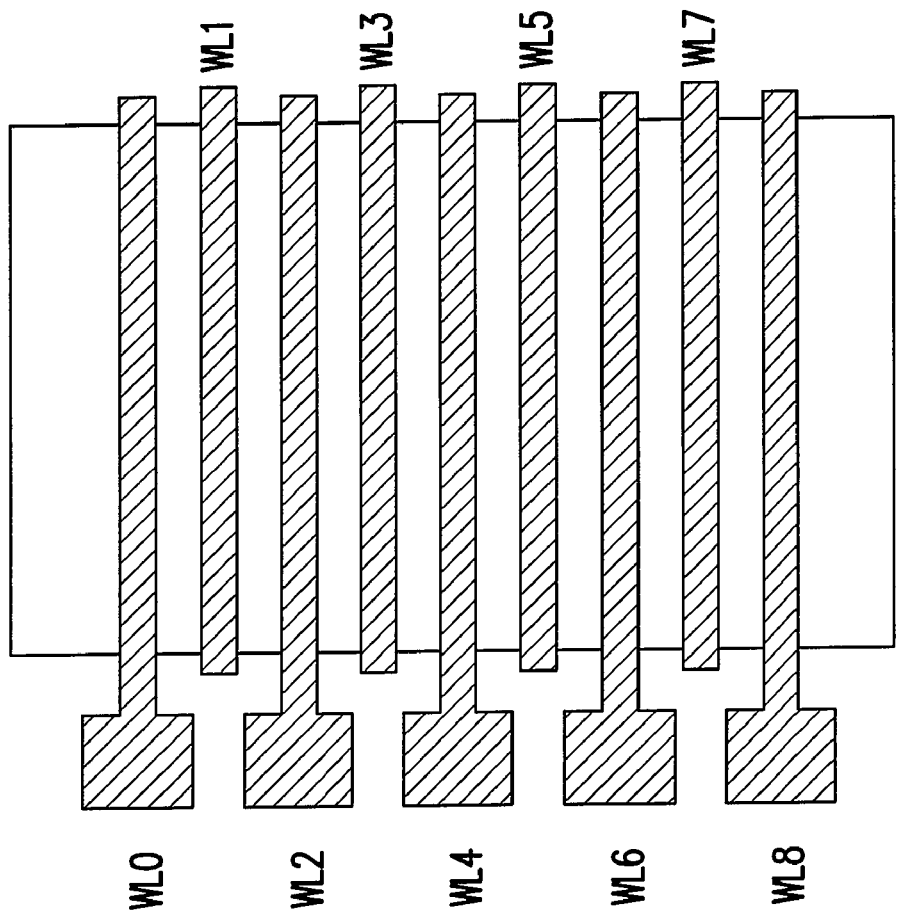
FIG. 2A is a top view of a bit line layout.
Figure 2B:
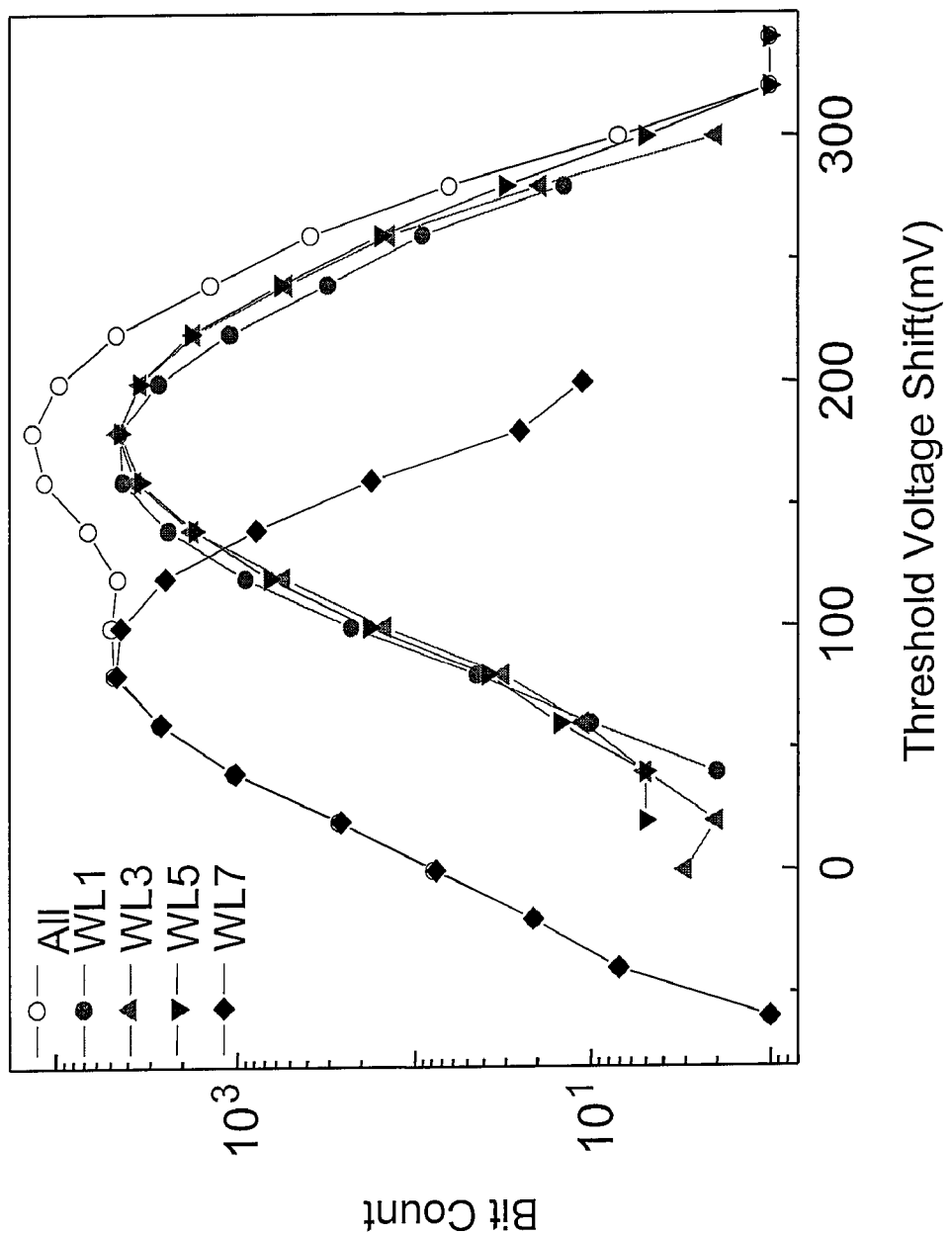
FIG. 2B is a diagram illustrating a relationship between bit counts and threshold voltage shift values for different word lines.

Reference will now be made in detail to the present preferred embodiments of the invention, examples of which are illustrated in the accompanying drawings. Wherever possible, the same reference numbers are used in the drawings and the description to refer to the same or like parts.

Figure 4B:
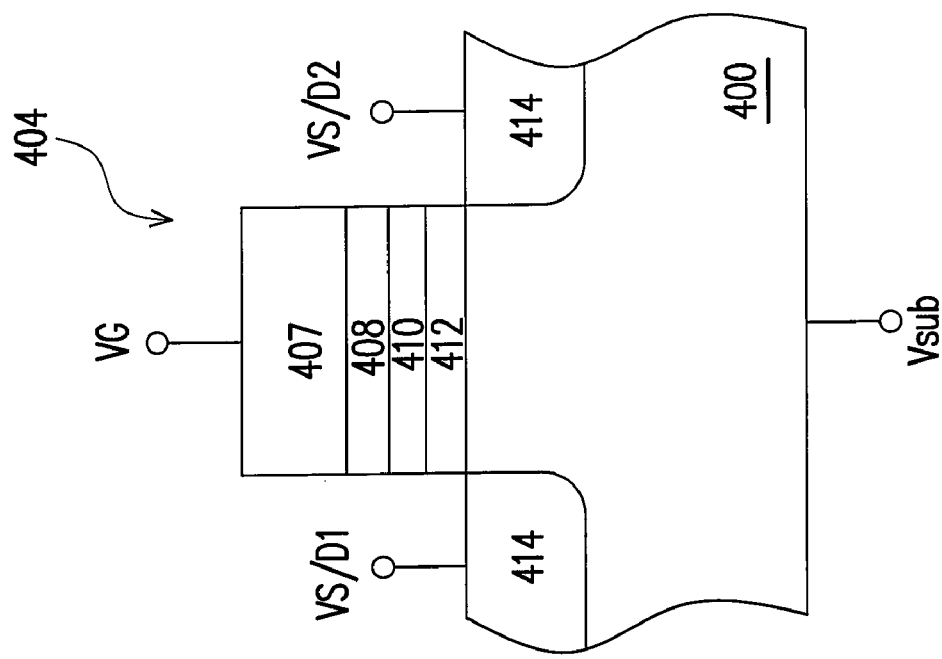
FIG. 4B is a cross-sectional view of the memory cell along line I-I' in FIG. 4A.
Figure 4A:
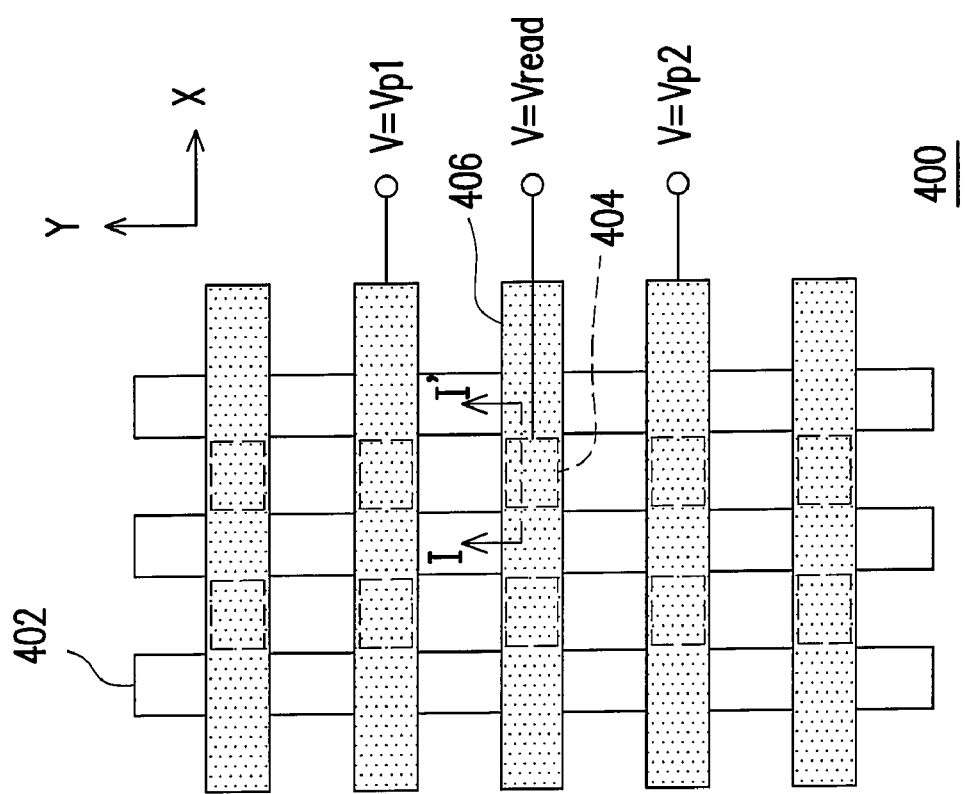
FIG. 4A is a top view of a non-volatile memory array according to one embodiment of the present invention.

FIG. 4A is a top view of a non-volatile memory array structure according to one embodiment of the present invention. FIG. 4B is a cross-sectional view of a memory cell along line I-I' in FIG. 4A. The numbers of the memory cells, word lines and bit lines in FIG. 4A are merely exemplary, not used to limit this present invention.

Referring to FIG. 4A, the non-volatile memory of this embodiment mainly comprises: a substrate 400, a plurality of buried bit lines 402, a plurality of memory cells 404 and a plurality of word lines (WL) 406. The buried bit lines 402 are disposed in the substrate 400 and arranged in parallel in a column direction (Y direction) and every buried bit line 402 is, for example, a doped region. In addition, the memory cells 404 are disposed on the substrate 400 between each two adjacent buried bit lines 402 and are arranged in 2D array. The word lines 406 are arranged in parallel in a row direction (X direction) and every word line 406 is connected with the memory cells 404 in the same row in series, wherein the material of the word lines 406 is, for example, doped polysilicon.

Referring to FIG. 4B, FIG. 4B is the cross-sectional view of one of the memory cells 404. The memory cell 404 of this embodiment is a nitride-based memory cell comprising a charge tunneling layer 412, a charge trapping layer 410, a charge barrier layer 408, a control gate 407 and two doped regions 414. Wherein the control gate 407 is disposed on the substrate 400 and the material of the control gate 407 is, for example, doped polysilicon. The charge trapping layer 410 is disposed between the control gate 407 and the substrate 400. The charge trapping layer 410 of this embodiment is, for example, a nitride-based material layer, wherein the material of the nitride-based material layer is, for example, silicon nitride, silicon oxynitride or any other nitride material capable of trapping charges into itself. The charge barrier layer 408 is disposed between the control gate 407 and the charge trapping layer 410, and the material of that is silicon oxide or silicon oxide/silicon nitride/silicon oxide, for example. The charge tunneling layer 412 is disposed on the substrate 400 under the charge trapping layer 410. The charge tunneling layer 412 is a oxide layer, and the material of that is, for example, silicon oxide. Furthermore, the two doped regions 414 respectively serve as a source region and a drain region of the memory cell 404. The two doped regions 414 are disposed in the substrate 400 at two sides of the control gate 407 and are a part of the buried bit lines 402.

Figure 4C:
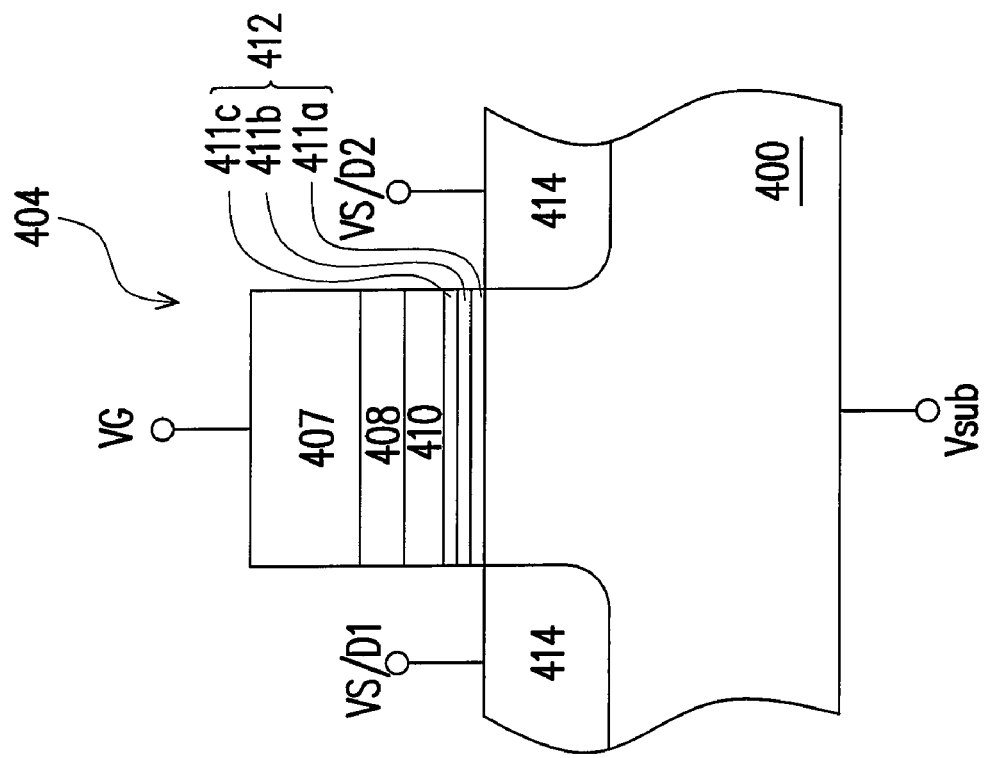
FIG. 4C is a top view of a non-volatile memory array according to another embodiment of the present invention.

Referring to FIG. 4C, the charge tunneling layer 412 is a complex layer, for example. The complex layer is formed on the substrate which comprising a first oxide layer 411a, a nitride layer 411b and a second oxide layer 411c. The thickness of the first oxide layer 411a is smaller than 2 nm, preferred between 0.5~2 nm, further preferred smaller than 1.5 mn. The thickness of the nitride layer 411b is smaller than 2 nm, preferred between 1~2 nm. The thickness of the second oxide layer 411c is smaller than 2 nm, preferred between 1.5~2 nm.

As illustrated in the aforementioned Prior Art, the applicant of the present invention discovered that the coupling interference issue also exists in the nitride-based memory when miniaturizing the memory cell. In solution, the present invention provides a new operation method. The method of the present invention is described hereinafter accompanying with FIG. 4A and FIG. 4B.

Referring to FIG. 4A and FIG. 4B, the operation method of a memory in this embodiment is that a reading operation is performed on a selected memory cell 404 (i.e. applying a reading operation voltage, Vread), a positive voltage Vp1 is applied to the word line 406 adjacent to one side of the selected memory cell 404, and a positive voltage Vp2 is applied to another word line 406 adjacent to the other side of the selected memory cell 404.

The aforementioned reading operation comprises that a gate voltage VG is applied to a control gate 407 of the selected memory cell 404, a source/drain voltage VS/D1 and VS/D2 are applied to two doped regions 414 respectively, and a substrate voltage Vsub is applied to a substrate 400 so as to read the selected memory cell 404. Wherein, the gate voltage VG is 3~5 volt, for example. The source/drain voltage VS/D1 is, for example, 1~1 volt, and the source/drain voltage VS/D2 is, for example, 0 volt. The substrate voltage Vsub is, for example, 0 volt.

In addition, the positive voltage Vp1 applied to the word line 406 adjacent to one side of the selected memory cell 404 is 0.5~2 volt, for example. The positive voltage Vp2 applied to another word line 406 adjacent to the other side of the selected memory cell 404 is 0.5~2 volt, for example. In one embodiment, the positive voltage Vp1 is, for example, equal to the positive voltage Vp2, wherein the voltage thereof is, for example, 0.5~2 volt.

It should be noted that when performing the reading operation in the selected memory cell, the operation method for applying the positive voltages to the adjacent word lines can reduce the coupling interference among the word lines due to the miniaturization of the memory cell.

Figure 3A:
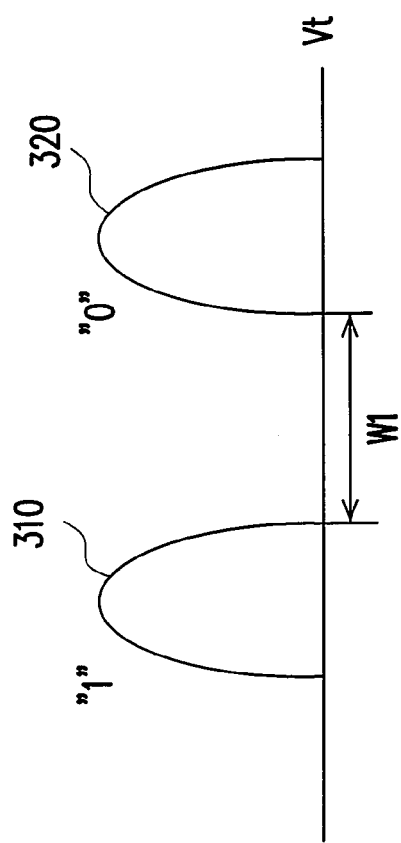
FIG. 3A is a threshold voltage diagram of a nitride-based memory cell without consideration of a coupling interference issue.
Figure 3B:
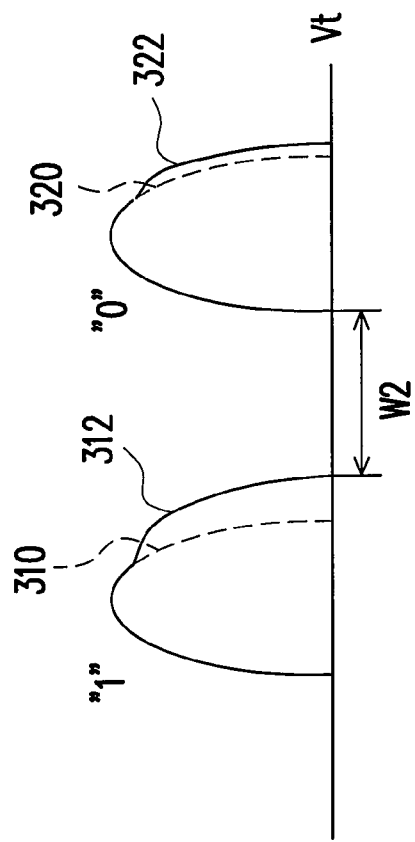
FIG. 3B is a threshold voltage distribution diagram of the nitride-based memory cell in consideration of the coupling interference issue.
Figure 5:
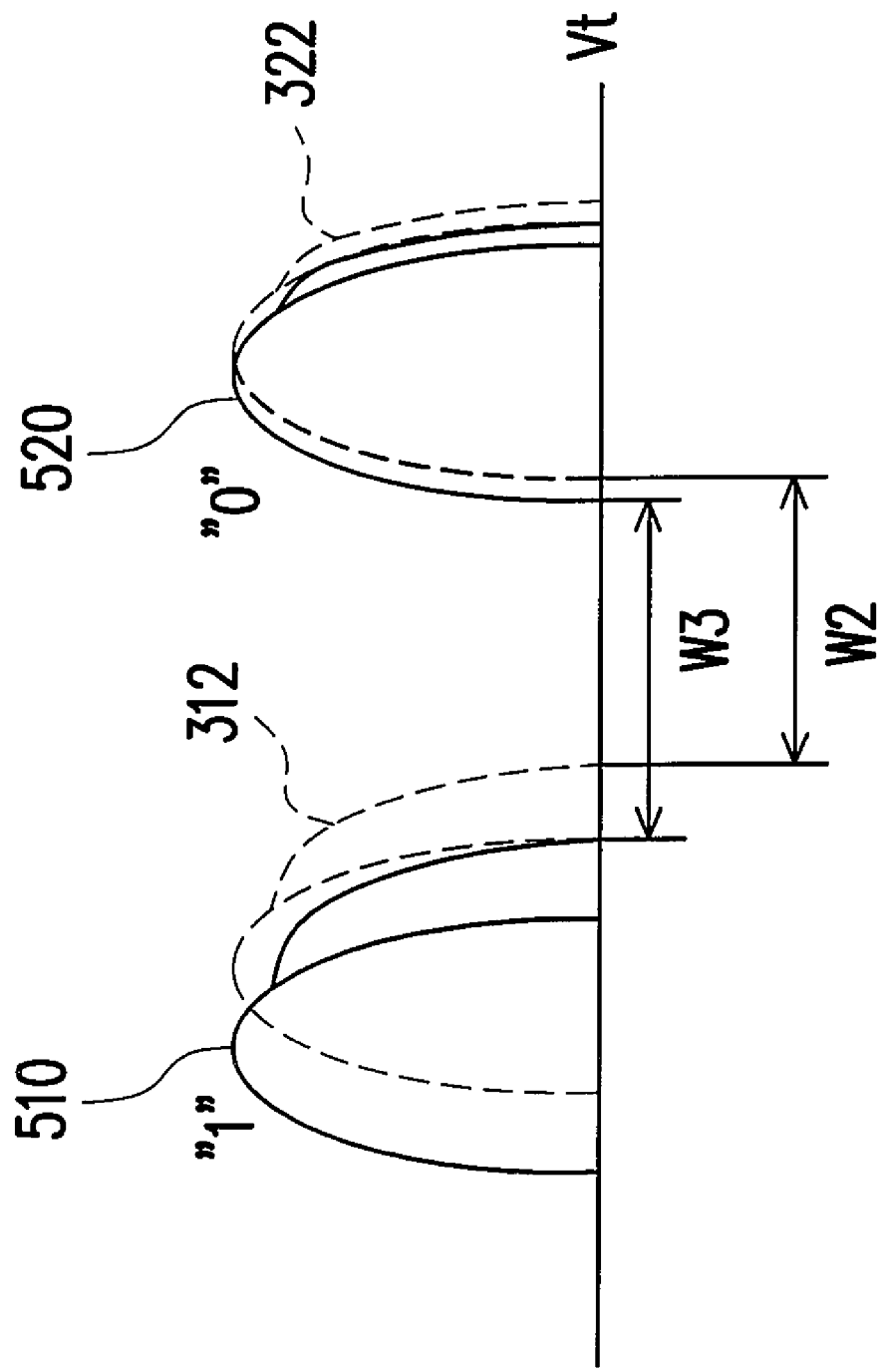
FIG. 5 is a threshold voltage distribution diagram of the memory cell measured by using the operation method of the present invention.

FIG. 5 is a threshold voltage (Vt) distribution diagram of the memory cell measured by using the operation method of the present invention. In FIG. 5, the Vt distribution diagram in FIG. 3B is therein combined together for a comparison.

As shown in FIG. 5, by using the method provided by the present invention, the Vt where the data storage state is "1" can shift to be a curve marked as numeral 510; and the Vt where the data storage state is "0" can shift to be the curve marked as numeral 520. From comparing the Vt distribution curves 510 and 312 and from comparing the Vt distribution curves 520 and 322, it is known that the method of the present invention can certainly reduce the coupling interferences issue. It should be mentioned that the coupling interference issue will have different influences to different data storage states of the nitride-based memory structure. Similarly, when using the method of the present invention to reduce the coupling interference, the data storage state ("1" herein) that makes the threshold voltage shift to a greater degree has a better reduction effect; and the data storage state ("0" herein) that makes the Vt shift to a less degree has a less reduction effect. Therefore, an operation window W3 obtained by using the method of the present invention is wider than an operation window W2 affected by the coupling interference.

It is of certainty that the method of the present invention can be applied not only to the 2 bits/cell nitride-based memory cell, but also to a 4 bits/cell, 8 bits/cell, or other multi-level-bits/ cell nitride-based memory cells.

In summary, the method of the present invention can reduce the coupling interference, thereby preventing the Vt voltage from being increased and affecting the operation of the devices and obtaining a bigger operation window. Moreover, the present invention can overcome the limitations of miniaturization and as a result, the fabricating techniques of the memory cells are advancing toward ever-miniaturizing dimensions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method for a non-volatile memory, suitable for a memory cell array comprising a plurality of buried bit lines arranged in parallel along a column direction and a plurality of word lines arranged in parallel along a row direction which is composed of a plurality of nitride-based memory cells, the operation method thereof comprising:

selecting the memory cell, and applying a first positive voltage to the word line adjacent to one side of the selected memory cell, and applying a second positive voltage to another word line adjacent to the other side of the selected memory cell.

2. The operation method for the non-volatile memory as claimed in claim 1, wherein a method of selecting the memory cell comprises: applying a gate voltage to a control gate of the selected memory cell, applying a first source/drain voltage and a second source/drain voltage to two doped regions respectively, applying a substrate voltage to a substrate for reading the selected the memory cell.

3. The operation method for the non-volatile memory as claimed in claim 1, wherein the first positive voltage is 0.5~2 volt.

4. The operation method for the non-volatile memory as claimed in claim 1, wherein the second positive voltage is 0.5~2 volt.

5. The operation method for the non-volatile memory as claimed in claim 1, wherein the first positive voltage is equal to the second positive voltage, and the voltage thereof is 0.5~2 volt.

6. The operation method for the non-volatile memory as claimed in claim 2, wherein the gate voltage is 3~5 volt.

7. The operation method for the non-volatile memory as claimed in claim 2, wherein the first source/drain voltage is 1~2 volt.

8. The operation method for the non-volatile memory as claimed in claim 2, wherein the second source/drain voltage is 0 volt.

9. The operation method for the non-volatile memory as claimed in claim 2, wherein the substrate voltage is 0 volt.

10. The operation method for the non-volatile memory as claimed in claim 1, wherein each of the memory cells comprising:

a control gate disposed on a substrate;

a plurality of doped regions disposed in the substrate at sides of the control gate;

a nitride charge trapping layer disposed between the control gate and the substrate;

a charge barrier layer disposed between the nitride charge trapping layer and the control gate; and a charge tunneling layer disposed between the nitride charge trapping layer and the substrate.

11. The operation method for the non-volatile memory as claimed in claim 10, wherein the charge tunneling layer comprises an oxide layer or a complex layer.

12. The operation method for the non-volatile memory as claimed in claim 11, wherein the complex layer is formed on the substrate which comprising a first oxide layer, a nitride layer and a second oxide layer.

13. The operation method for the non-volatile memory as claimed in claim 12, wherein the thickness of the first oxide layer is smaller than 2 nm.

14. The operation method for the non-volatile memory as claimed in claim 12, wherein the thickness of the first oxide layer is between 0.5~2 nm.

15. The operation method for the non-volatile memory as claimed in claim 12, wherein the thickness of the first oxide layer is smaller than 1.5 nm.

16. The operation method for the non-volatile memory as claimed in claim 12, wherein the thickness of the nitride layer is smaller than 2 nm.

17. The operation method for the non-volatile memory as claimed in claim 12, wherein the thickness of the nitride layer is between 1~2 nm.

18. The operation method for the non-volatile memory as claimed in claim 12, wherein the thickness of the second oxide layer is smaller than 2 nm.

19. The operation method for the non-volatile memory as claimed in claim 12, wherein the thickness of the second oxide layer is between 1.5~2 nm.

20. A method for improving coupling interference of a nitride-based memory, suitable for a memory cell array comprising a plurality of buried bit lines arranged in parallel along a column direction and a plurality of word lines arranged in parallel along a row direction which is composed of a plurality of nitride-based memory cells, the method thereof comprises:

applying a first positive voltage to the word line adjacent to one side of the selected memory cell, and applying a second positive voltage to another word line adjacent to the other side of the selected memory cell, when performing a reading operation to the selected memory cell.

21. The method for improving the coupling interference of the nitride-based memory as claimed in claim 20, wherein the first positive voltage is 0.5~2 volt.

22. The method for improving the coupling interference of the nitride-based memory as claimed in claim 20, wherein the second positive voltage is 0.5~2 volt.

23. The method for improving coupling interference of a nitride-based memory as claimed in claim 20, wherein the first positive voltage is equal to the second positive voltage, and the voltage thereof is 0.5~2 volt.

24. The method for improving coupling interference issue of the nitride-based memory as claimed in claim 20, wherein the reading operation comprises:

applying a gate voltage to a control gate of the selected memory cell; applying a first source/drain voltage and a second source/drain voltage to two doped regions respectively; and applying a substrate voltage to a substrate.

25. The method for improving the coupling interference of the nitride-based memory as claimed in claim 24, wherein the gate voltage is 3~5 volt.

26. The method for improving the coupling interference of the nitride-based memory as claimed in claim 24, wherein the first source/drain voltage is 1~2 volt.

27. The method for improving the coupling interference of the nitride-based memory as claimed in claim 24, wherein the second source/drain voltage is 0 volt.

28. The method for improving the coupling interference of the nitride-based memory as claimed in claim 24, wherein the substrate voltage is 0 volt.

29. The operation method for improving the coupling interference of the nitride-based memory as claimed in claim 20, wherein each of the memory cells comprising:
   a control gate disposed on a substrate;
   a plurality of doped regions disposed in the substrate at sides of the control gate;
   a nitride charge trapping layer disposed between the control gate and the substrate;
   a charge barrier layer disposed between the nitride charge trapping layer and the control gate; and
   a charge tunneling layer disposed between the nitride charge trapping layer and the substrate.

30. The operation method for improving the coupling interference of the nitride-based memory as claimed in claim 29, wherein the charge tunneling layer comprises an oxide layer or a complex layer.

31. The operation method for improving the coupling interference of the nitride-based memory as claimed in claim 30, wherein the complex layer is formed on the substrate which comprising a first oxide layer, a nitride layer and a second oxide layer.

32. The operation method for improving the coupling interference of the nitride-based memory as claimed in claim 31, wherein the thickness of the first oxide layer is smaller than 2 nm.

33. The operation method for improving the coupling interference of the nitride-based memory as claimed in claim 31, wherein the thickness of the first oxide layer is between 0.5~2 nm.

34. The operation method for improving the coupling interference of the nitride-based memory as claimed in claim 31, wherein the thickness of the first oxide layer is smaller than 1.5 nm.

35. The operation method for improving the coupling interference of the nitride-based memory as claimed in claim 31, wherein the thickness of the nitride layer is smaller than 2 nm.

36. The operation method for improving the coupling interference of the nitride-based memory as claimed in claim 31, wherein the thickness of the nitride layer is between 1~2 nm.

37. The operation method for improving the coupling interference of the nitride-based memory as claimed in claim 31, wherein the thickness of the second oxide layer is smaller than 2 nm.

38. The operation method for improving the coupling interference of the nitride-based memory as claimed in claim 31, wherein the thickness of the second oxide layer is between 1.5~2 nm.

* * * * *